United States Patent [19]

Guglielmi et al.

[11] Patent Number: 4,712,190

[45] Date of Patent: Dec. 8, 1987

[54] SELF-TIMED RANDOM ACCESS MEMORY CHIP

[75] Inventors: Paul M. Guglielmi, Westboro, Mass.; Ronald J. Melanson, Sunnyvale, Calif.; Alan Kotok, Harvard, Mass.

[73] Assignee: Digital Equipment Corporation, Maynard, Mass.

[21] Appl. No.: 694,874

[22] Filed: Jan. 25, 1985

[51] Int. Cl.[4] .................................. G06F 12/00
[52] U.S. Cl. .................................. 364/900
[58] Field of Search ... 364/200 MS File, 900 MS File; 365/211; 307/279

[56] References Cited

U.S. PATENT DOCUMENTS

| | | | |
|---|---|---|---|
| 3,778,784 | 12/1973 | Karp | 307/279 |
| 4,110,842 | 8/1978 | Sarkissian | 365/211 |
| 4,328,558 | 5/1982 | Musa et al. | 364/900 |
| 4,335,459 | 6/1982 | Miller | 371/38 |
| 4,396,980 | 8/1983 | Hingarh | 364/200 |

Primary Examiner—Raulfe B. Zache
Assistant Examiner—Emily Y. Chan
Attorney, Agent, or Firm—Cesari and McKenna

[57] ABSTRACT

A self-timed random access memory circuit is designed on a single monolithic integrated circuit chip. The chip includes a random access memory including addressable storage locations, address decoding circuitry, data input and output circuitry and write enable circuitry. In addition, the chip includes input latches connected to chip input terminals which store data, address and operation control signals from off-chip circuitry in response to a timing signal, also from the off-chip circuitry. Also in response to the timing signal, an output latch on the chip stores data from the random access memory for transmission to output terminals, where the data is available to the off-chip circuitry. The input and output latches permit the self-timed random access memory circuit to perform in a pipelined manner. In addition, the chip includes circuitry that generates the control signals, in response to the latched control signals, with the correct timing for controlling the random access memory, obviating the necessity of the system designer designing a system including the chip having to design off-chip control circuitry with the required timing.

6 Claims, 9 Drawing Figures

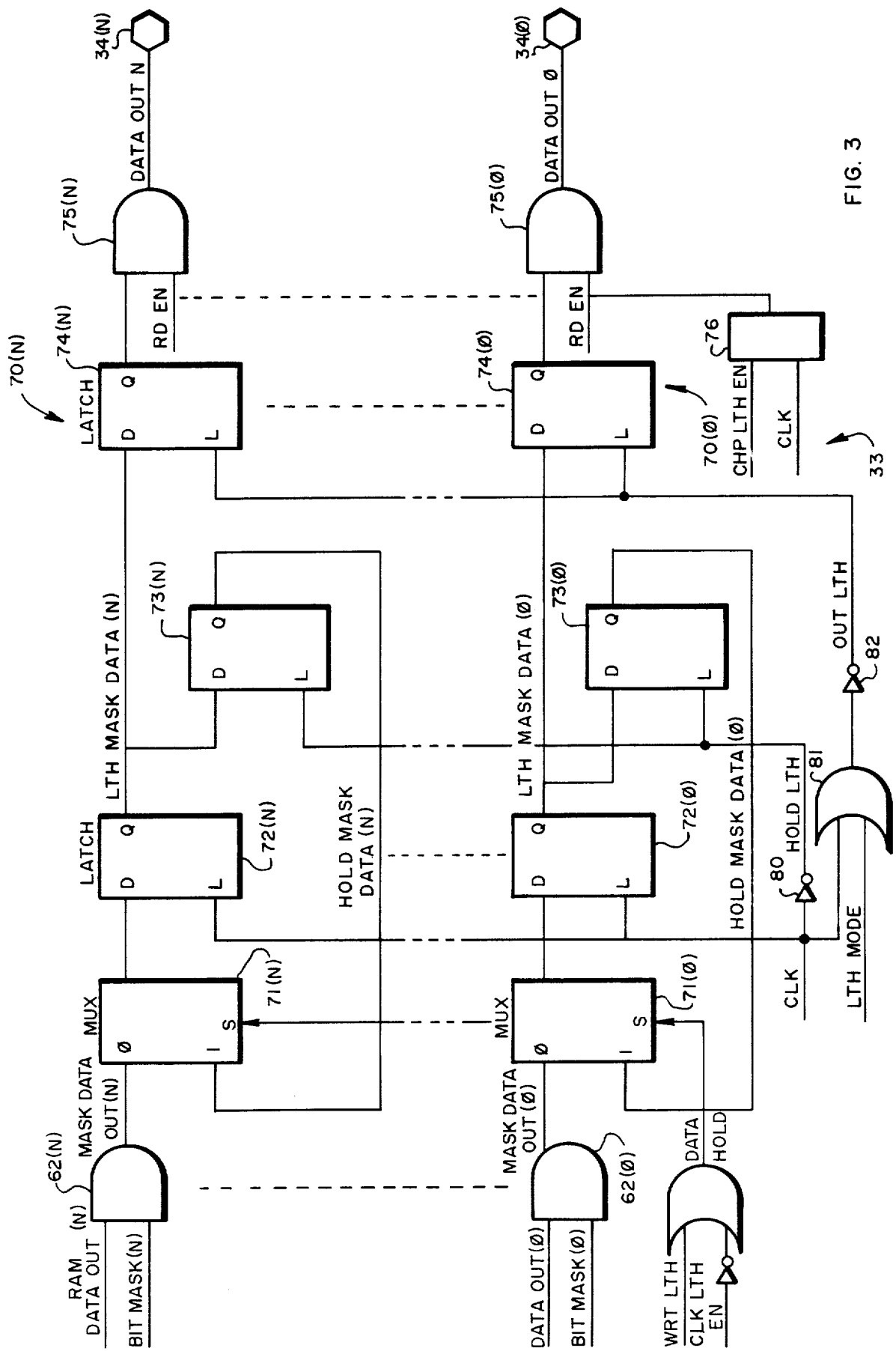

TIMING DIAGRAM (LTH MODE NEGATED)

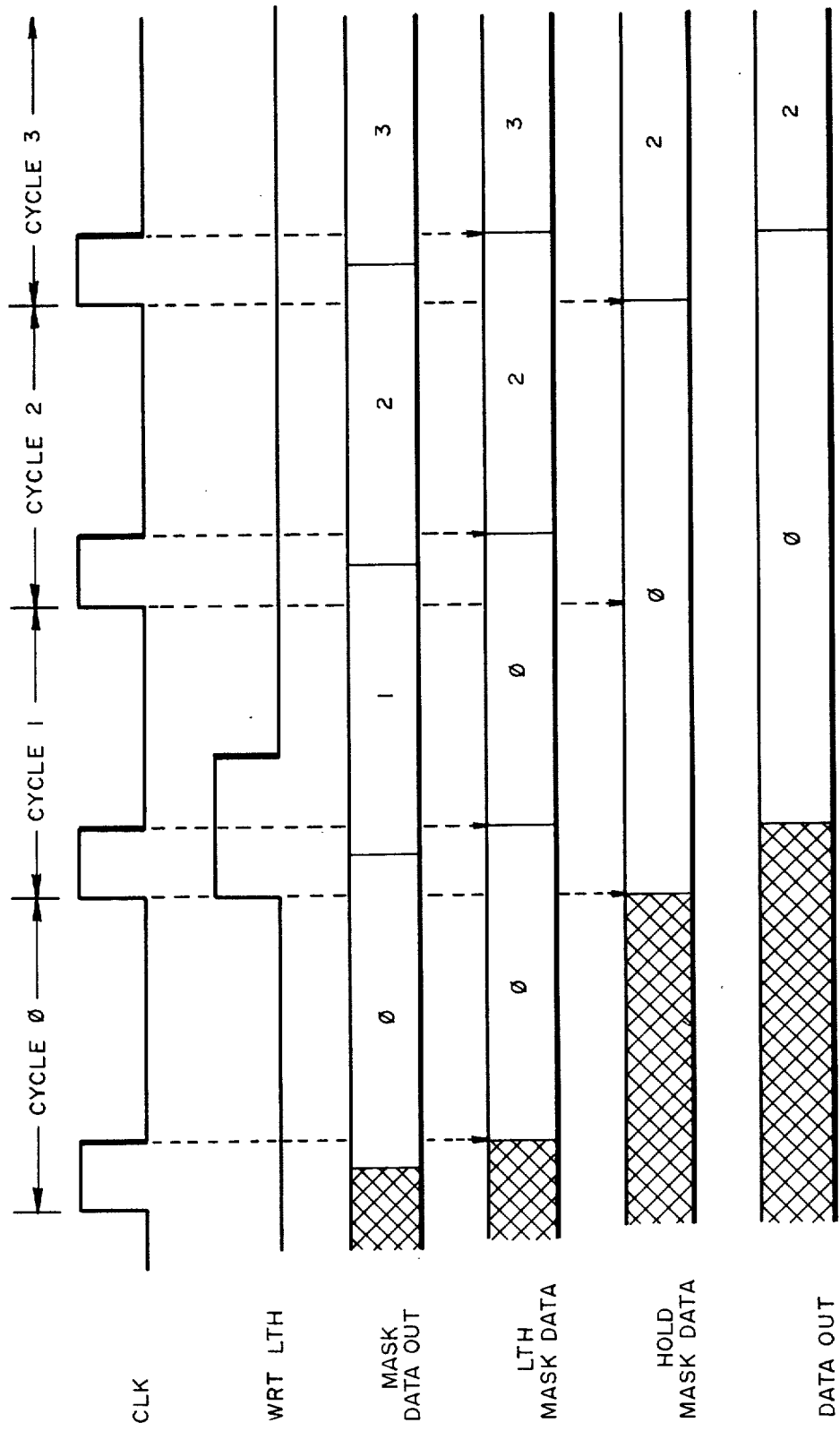

SELF-TIMED RANDOM ACCESS MEMORY CHIP

BACKGROUND OF THE INVENTION

1. Field of the Invention

The invention relates generally to the field of integrated circuit chips for use in digital data processing systems, and more specifically to random access memory (RAM) chips used in various portions of such systems to store digital data for processing or other purposes, such as control or the like.

2. Description of the Prior Art

Modern digital data processing systems, that is, computer systems, typically use a large number of random access memory (RAM) chips to store data and other information for use in processing and control of such systems. In addition to using them in main memories, modern computer systems also use RAM chips in cache memories, that is, relatively small, high speed data storage subsystems connected directly to an associated central processing unit (CPU) by a private bus and accessible primarily thereby. Random access memory chips are also used in, for example, translation buffers in the CPU that are used in translating from virtual to physical addresses in computer systems employing virtual memory techniques. RAM chips may also be used in, for example, writable control stores used to store microcode sequences for processing of instructions, and in similar data storage areas in the CPUs.

A major problem with current random access memory chips is that they require the external circuitry to supply a number of input signals having fairly complex relative timing requirements and to maintain them in the required conditions throughout the storage or retrieval operation in order to operate properly.

In current memory systems, the random access memory (RAM) chips receive data and address signals from a plurality of data and address registers, and also receive read/write and depending on the particular chips, other operation control signals. If the required operation is a read operation, the RAM also transmits the read data to a data output register, which latches the read data and makes it available to other circuitry in the computer system. The operation of the memory system is limited by the potential skew of the numerous signals transmitted to and from the RAM, by the set-up times required for the signals to shift, if necessary, between negated and asserted conditions, and also by the circuit delays inherent in the operation of the circuits themselves. In current memory systems, the off-chip registers and control signal generation circuitry must maintain the address, data (if a write operation) and control signals at the required levels during the entire memory operation.

SUMMARY OF THE INVENTION

The invention provides a new and improved random access memory chip having a random access memory in addition to input and output storage registers for storing input data, address and control information and circuitry for generating a storage/retrieval enabling signal for enabling the data to be stored at specified addresses or retrieving data from the specified addresses in the memory, all on the single chip.

More specifically, the invention provides a RAM chip having a plurality of addressable storage locations, a plurality of input registers each for receiving and latching data, address, and control signals, as well as an output register for receiving data during a retrieval operation from an addressed storage location and transmitting the stored data to an output terminal on the chip. The chip also receives, from external circuitry, a clock signal which synchronizes the latching of the data, address, and control signals, which also synchronizes the beginning of the on-chip generation of the internally generated control signals that control the storage of data in the addressed locations or the transmission of data therefrom.

Placing the input registers, output register and control signal generating circuitry on the RAM chip, all being responsive to the system clock signal, allows the chip to be operated in a pipelined manner when connected in a system between off-chip input address and data registers and an output data register. Placing registers onto the chip greatly reduces the skew and set up times for the signals between the on-chip registers and the actual memory circuitry, allowing the chip to operate quite fast. Further, when operated in a pipelined manner, the skew and set-up times for the off-chip signals can take place for a subsequent memory operation, while the chip is performing a current operation.

BRIEF DESCRIPTION OF THE DRAWINGS

The invention will be pointed out with particularity in the appended claims. The above and other advantages of the invention may be better understood by referring to the following description taken in conjunction with the accompanying drawings, in which:

FIG. 3 is a logic diagram of an output register which is useful in connection with the circuit depicted on FIG. 1;

FIGS. 4A and 4B are timing diagrams useful in understanding the operation of the circuit depicted on FIG. 1;

DETAILED DESCRIPTION OF AN ILLUSTRATIVE EMBODIMENT

Figure 1:
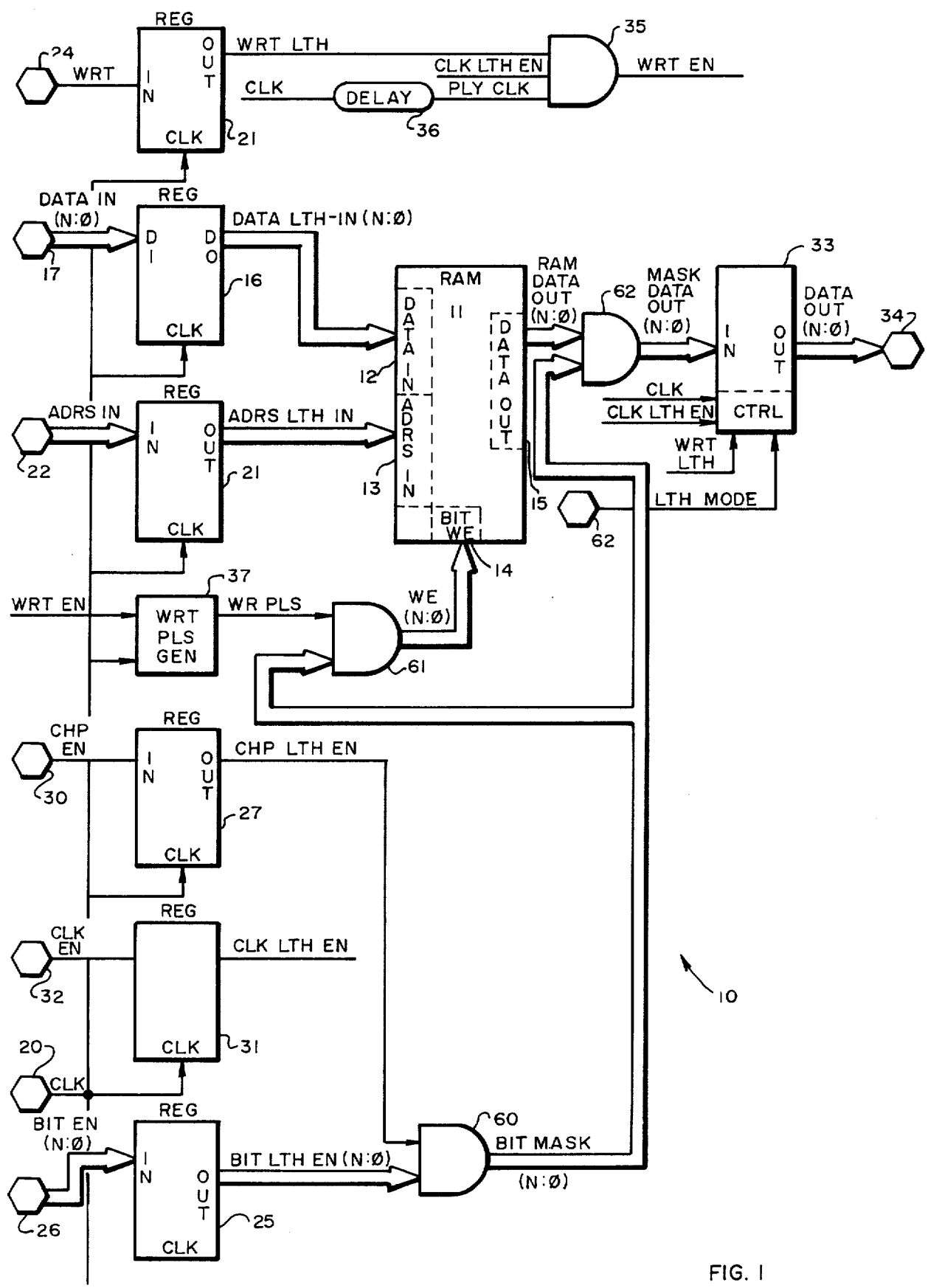
FIG. 1 is a block diagram of a self-timed random access memory circuit for use on a single chip constructed in accordance with the invention.

With reference to FIG. 1, the invention provides a new and improved self-timed random access memory (RAM) circuit 10 residing on a single integrated circuit chip. The self-timed RAM circuit includes a random access memory (RAM) 11 which includes a plurality of addressable storage locations. In one specific embodiment, the RAM 11 includes 256 locations of four bits each. The RAM 11 receives data, address, and bit write enable signals through respective input terminals 12, 13 and 14, and transmits data signals through an output terminal 15.

The data signals input to input terminals 12, namely the DATA LTH IN (N:0)latched data signals, are provided by a register 16 which latches parallel DATA IN (N:0) signals received from input terminals 17 on respective lines in response to the receipt of a CLK clock signal from a terminal 20. Terminals 17 and 20 represent input terminals to the chip on which the self-timed RAM circuit 10 resides, the DATA IN and CLK clocking signals being provided by circuitry external to the chip. The number of lines for carrying the DATA IN (N:0) and the DATA LTH IN (N:0) signals corresponds to the number of bits in each storage location.

In addition, the address signals coupled to address input terminal 13 of RAM 11 comprise ADRS LTH IN latched address in signals provided by a register 21. The register 21 receives ADRS IN signals from terminals 22. The ADRS IN signals are latched in register 21 in response to the CLK clock signal from terminal 20. The number of ADRS LTH IN signals coupled in parallel to address in terminals 13 are determined by the number of addressable locations in RAM 11. In the embodiment in which RAM 11 has 256 locations, the ADRS LTH IN signals comprise eight individual signals provided in parallel. The signals are binary-encoded and are decoded in circuitry in RAM 11 to identify a single storage location.

The clock signal received at terminal 20 also controls a register 23 which receives a WRT write signal from a terminal 24. The WRT write signal identifies the operation, namely a read or a write operation, to be performed in connection with the location identified by the ADRS IN signals that are contemporaneously latched in register 21. When the WRT write signal is at a high (asserted) level, a write operation is to be performed; otherwise a read operation is to be performed. The output signal from register 23, namely, a WRT LTH latched write signal, is used by control circuitry described below to control the generation of signals received at bit write enable terminals 14 to control writing in RAM 11. In response to asserted signals at the bit write enable terminals 14, the RAM 11 stores the DATA LTH IN (N:0) data signals in respective bit locations of the location identified by the ADRS LTH IN (N:0) address signals. If, however, the signals at the bit write enable terminals 14 are negated, the respective bit locations of the addressed location are read and the data stored therein is transmitted through output terminals 15 as RAM DATA OUT (N:0) signals.

The CLK clock signal also controls a register 25 which receives BIT EN bit enabling signals from an input terminal 26. The signals stored in register 25 are transmitted as BIT LTH EN latched bit enabling signals. As has been noted, in the aforementioned specific embodiment of the RAM 11, each addressable storage location comprises bit storage locations, and the BIT EN signals comprise a like number of individual signals, each of which is associated with one of the bit locations in the storage locations of RAM 11.

The clock signal also controls a register 27 which receives a CHP EN chip enabling signal from a terminal 30. The register 27 transmits a CHP LTH EN latched chip enabling signal. When the CHP LTH EN latched chip enabling signal is negated, the circuit 10 is disabled from operating.

The CLK clock signal received at terminal 20 also controls a register 31, which receives and stores a CLK EN clock enabling signal from a terminal 32. Register 31 provides a CLK LTH EN latched clock enabling output signal, which, when asserted, enables portions of the circuitry of the self-timed RAM circuit 10 to operate, as explained below.

In addition to the above-noted input registers, self-timed RAM circuit 10 includes an output register 33 which receives MASK DATA OUT (N:0) mask data out signals. The MASK DATA OUT (N:0) signals are derived from the RAM DATA OUT (N:0) signals from RAM 11 as explained below. Output register 33 transmits DATA OUT output data signals to output terminals 34.

When off-chip circuitry is to store data in or retrieve data from self-timed RAM circuit 10, it transmits the respective data address and control input signals to terminals 17, 22, 24, 26, 30 and 32 and asserts the CLK clock timing signal which is received at terminal 20. The input signals are then latched in registers 16, 21, 23, 25, 27 and 31. If the WRT write signal is asserted, the register 23 transmits an asserted WRT LTH latched write signal to an AND gate 35, which transmits a WRT EN write enabling signal a short time later, the delay being determined by a delay line 36, if the CLK LTH EN latched clock enabling signal from register 31 is asserted. The input signal to delay line 36 is the CLK clock signal from terminal 20, and the delay line is provided to time the WRT EN signal so as to correctly position, in time, the write enable signals at terminals 14 of RAM 11. The output of the delay line 36 comprises a DLY CLK delayed clocking signal, which provides the third input signal to AND gate 35.

Figure 2A:
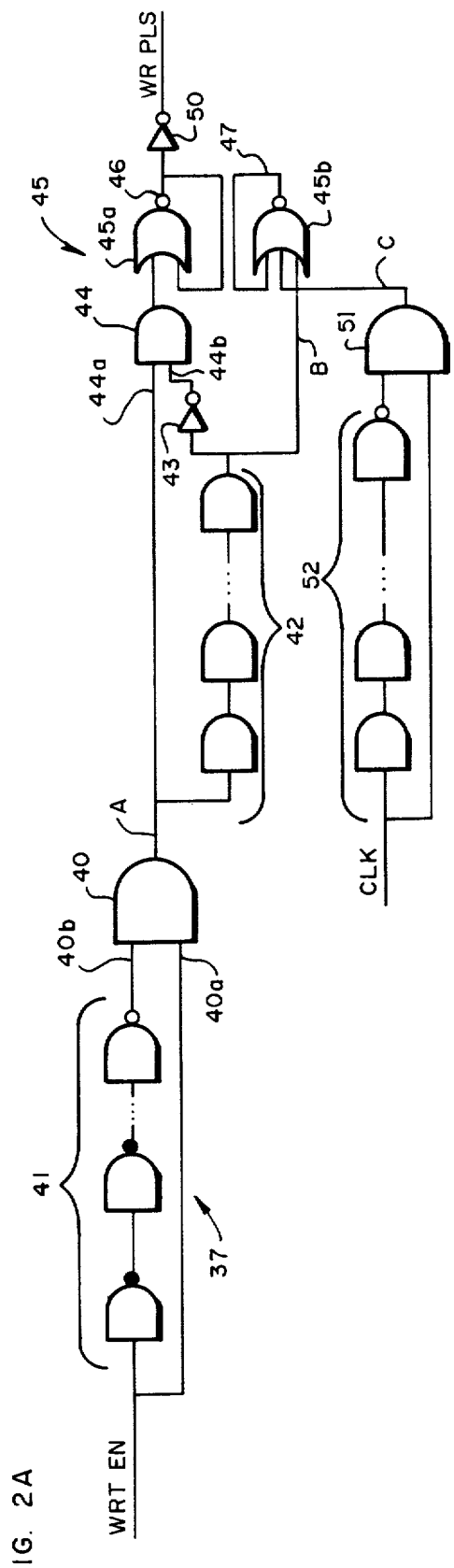
FIG. 2A is a logic diagram detailing a write enabling signal generator useful in the circuit depicted on FIG. 1.
Figure 2B:
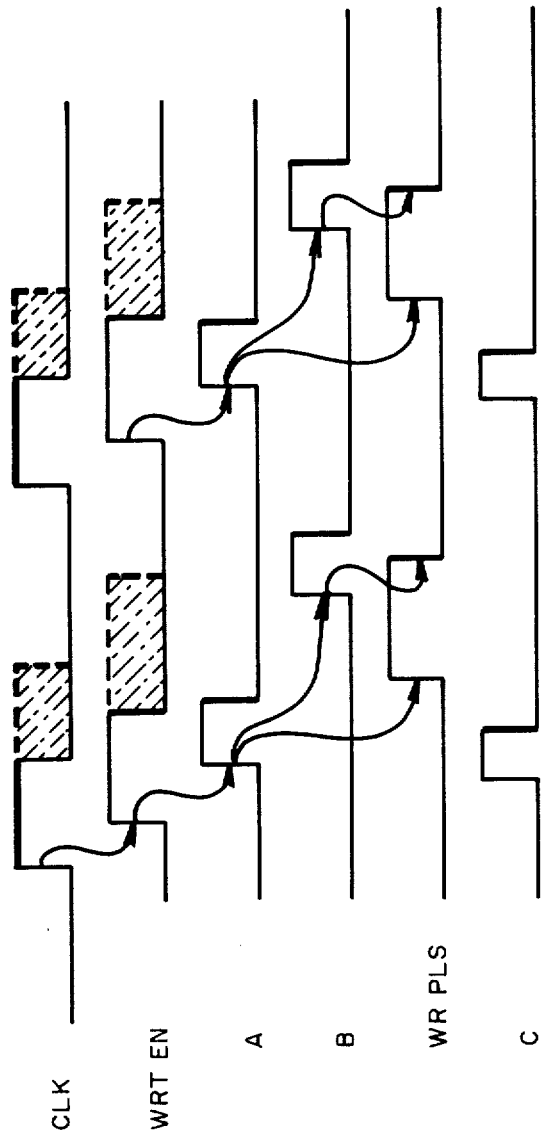
FIG. 2B is a timing diagram which is useful in understanding the operation of the circuit depicted in FIG. 2A.

The WRT EN write enabling signal is transmitted to a write pulse generator 37, the circuit for which is depicted in FIG. 2A. With reference to FIGS. 2A and 2B, FIG. 2B containing a timing diagram detailing the operation of the circuit depicted in FIG. 2A, the write pulse generator comprises an AND gate 40 which receives at one input terminal 40a the WRT EN write enabling signal directly, and at the other input terminal 40b a signal from a set of serially-connected gates followed by an inverter generally indicated by the reference numeral 41. The output signal of AND gate 40, namely, signal A, is transmitted to an input terminal 44a of AND gate 44, and also to a second series of gates generally indicated by the reference numeral 42. The B output signal from the output terminal of the last of gates 42 is transmitted through an inverter 43 to the second input terminal 44b of an AND gate 44. The B output signal from the last of gates 42 is also transmitted to one input terminal of a NOR gate 45b, which is connected to a NOR gate 45a to form a flip-flop 45. The other input signal to the NOR gates comprising flip-flop 45 is provided by the signal from the output terminal of AND gate 44; specifically, the output terminal of AND gate 44 is connected to an input terminal of NOR gate 45a. The output signal of flip-flop 45, at output terminal 46 of NOR gate 45a, is complemented through an inverter 50 as the WR PLS write pulse signal.

In addition, the write pulse generator 37 also receives the CLK clock signal, which enables an AND gate 51 and a set of gates followed by an inverter 52 to assert a C pulse signal. The C pulse signal is coupled to an input of NOR gate 45b to establish an initial condition for the flip-flop, most particularly when the chip 10 is initially powered up.

With reference to the timing diagram of FIG. 2B, the operation of the circuit depicted in FIG. 2B of the write pulse generator circuit 37 is as follows. Before the assertion of the WRT EN write enabling signal, the output signal of gates 41 at terminal 40B is at a high (asserted) level. Accordingly, signal A and B are both at low (negated) levels. Initially, NOR gate 45A is energized so that the output signal at terminal 46 is at a high level, and NOR gate 45B is deenergized so that the output signal at its output terminal 47 is at a low level. At initial powering of the chip, this is enabled by the asserted C signal from AND gate 51. Accordingly, when the signal at node 46 is complemented by the inverter 50, the resulting WR PLS write pulse signal is at a low level.

When the WRT EN write enable signal shifts to a high (asserted) condition, since terminal 40B is already high, AND gate 40 is energized and the A signal is asserted as shown in FIG. 2B. Since the output signal of inverter 43 is already at a high level, AND gate 44 is energized to transmit a high signal to the connected input terminal of NOR gate 45A. NOR gate 45a forces the output signal at terminal 46 to go to a low (negated) condition, and, when inverted by inverter 50, the write pulse signal is asserted as shown in FIG. 2B. Also, when node 46 shifts to a low condition, NOR gate 45b is deenergized, and the output signal at terminal 47 goes low.

The time delay provided by gates 41 determines the length of the assertion of the A and B signals. For a time determined by the gate delay of gates 41, the A signal remains high. However, when the asserted WRT EN write enabling signal propagates to input terminal 40B through gates 41, the A signal goes low, deenergizing AND gate 44 and forcing the signal provided by it to the connected terminal of NOR gate 45a to a low condition. However, since the signal at terminal 47 is high, NOR gate 45A remains deenergized, the signal at node 46 remains low, and the WR PLS signal provided by inverter 50 remains high. Since the leading and trailing edges of the B signal are both delayed by gates 42 by the same amount of time, the length of assertion of the B signal is the same as the length of assertion of the A signal.

The gate delay of gates 42 determines the length of the WR PLS write pulse signal. As has been noted, when the leading edge of the A signal propagates through gates 42, the B signal goes to a high (asserted) condition, driving both the input signal to input terminal 44b of AND gate 44 and the signal at terminal 47 to a low (negated) condition. The first to be asserted of the output signal from AND gate 44 or the signal at terminal 47 drives the output signal of NOR gate 45a to a high (asserted) condition, which, in turn, drives the WR PLS signal to a negated state, as depicted in FIG. 2B.

The length of and spacing between the A and B signals determine the speed with which the WR PLS write pulse signal can be repeated. When the trailing edge of the A signal has been transmitted through gates 42, the B signal is returned to a low (negated) condition. However, since the signal at node 46 is already in a high (asserted) state, NOR gate 45b maintains the signal at terminal 47 in the low condition. When the B signal next goes low, the sequence of operations can repeat at the next assertion of the WRT EN write enabling signal.

The operation of gates 51 and 52 is similar to the operation of gates 40 and 41. After the initial condition of flip-flop 45 is determined by the C signal when the chip is initially powered. Thereafter, the conditions of the flip-flop are determined by the A and B signals, and the C signal is essentially redundant of the B signal, since, when the C signal is asserted, the B signal has already forced flip-flop 45 into a condition in which the WR PLS signal is negated.

With reference again to FIG. 1, the BIT LTH EN (N:0) latched bit enabling signals are transmitted to a set of AND gates represented by gate 60. One input terminal of each of the AND gates receives one of the BIT LTH EN signals as well as the CHP LTH EN latched chip enable signal from register 27. When the CHP LTH EN signal is asserted, the respective ones of gates 60 which also receive an asserted BIT LTH EN signal are energized to transmit asserted BIT MASK (N:0) bit mask signals.

The BIT MASK (N:0) signals are transmitted to a set of AND gates represented by gate 61. One input terminal of each of the AND gates receives one of the BIT MASK (N:0) signals. The other input terminal of all of the gates also receives the WR PLS write pulse signal from the write pulse generator 37. When the WR PLS signal is asserted, the ones of gates 61 receiving asserted BIT MASK (N:0) signals are energized to assert respective ones of the WE (N:0) write enable signals to energize corresponding ones of the bit write enable terminals 14.

The BIT MASK (N:0) signals are also transmitted to a set of gates generally indicated by reference numeral 62, which also receives the RAM DATA OUT (N:0) signals from RAM 11. The MASK DATA OUT (N:0) output signals from gates 62 are coupled to the output register 33 and are latched in response to the CLK clocking signal, CLK LTH EN latch clock enabling signal, WRT LTH latched write signal and an LTH MODE latch mode signal provided by external circuitry at terminal 62 of the chip.

FIG. 3 contains a detailed logic diagram of gates 62 and output register 33. With reference to FIG. 3, the gates 62 comprise a plurality of individual AND gates 62(N) through 62(0), each of which includes an input terminal which receives a corresponding RAM DATA OUT (N) through (0) signal from RAM 11. The other input terminal of each ANDgate receives the corresponding BIT MASK (N) through (0) from gates 60.

The output register 33 includes a number of stages 70(0) through 70(N), each of which includes an input multiplexer 71(0) through 71(N) which receives, at one input thereof, the MASK DATA OUT (0) through (N) signals from gates 62(0) through 62(N).

The output signals from multiplexers 71(0) through 71(N) are coupled to the "D" data input terminals of latches 72(0) through 72(N). The Q output terminals of the respective latches 72(0) through 72(N), through which LTH MASK DATA (N:0) latched mask data signals are transmitted, are connected to the "D" data input terminals of latches 73(0) through 73(N) and 74(0) through 74(N). All of the latches 72(0) through 72(N), 73(0) through 73(N) and 74(0) through 74(N) are level-sensitive latches which pass the signals at the respective D input terminal to a Q output terminal when a latch signal at an L input terminal is at a negated level, and latch and hold the signal at the D input terminal when the latch signal at the L input terminal is at an asserted level.

The LTH MODE latch mode signal enables output register 33 to operate in two modes depending on the asserted or negated condition of the signal. When the LTH MODE signal is asserted, the latches 72(0) through 72(N) latch the signals at the input terminals when the CLK clock signal is asserted, and the latches 73(0) through 73(N) and latch the LTH MASK DATA (N:0) signals previously latched in latches 72(0) through 72(N) when the CLK clock signal is next negated. When the LTH MODE signal is asserted, the latches 74(0) through 74(N) are essentially transparent, as they do not latch the signals.

When the LTH MODE signal is negated, the MASK DATA OUT (N:0) signals are also latched by latches 72(0) through 72(N) when the CLK clock signal is asserted, and the latches 73(0) through 73(N) and 74(0), through 74(N) to latch the LTH MASK DATA (N:0) signals from latches 72(0) through 72(N) when the clock signal is next negated. Thus, when the LTH MODE signal is negated, the latches 72(0) through 72(N) act as master latches, and the latches 73(0) through 73(N) and 74(0) through 74(N) act as slave latches, of master-slave latches.

The operation of data latches 72(0) through 72(N) is controlled by the CLK clock signal from terminal 20 (FIG. 1). Latches 73(0) through 73(N) are controlled by a HOLD LTH hold latch signal generated by an inverter 80. The HOLD LTH signal is the complement of the CLK clock signal. Latches 74(0) through 74(N) are controlled by an OUT LTH output latch signal from an OR gate 81 and inverter 82. When the LTH MODE latch mode signal is negated, the OUT LTH signal is asserted and negated in response to complementary transitions of the CLK timing signal. Accordingly, when the LTH MODE signal is negated, the latches 74(0) through 74(N) latch the LTH MASK DATA (N:0) signals from latches 72(0) through 72(N) when the CLK timing signal is negated, and pass them when the CLK signal is asserted. On the other hand, when the LTH MODE latch mode signal is negated, gate 81 is always energized and the OUT LTH signal is always negated. Accordingly, the output signals from latches 74(0) through 74(N) always follow the LTH MASK DATA (N:0) input signals from latches 72(0) through 72(N). In this mode, the latches 74(0) through 74(N) have no effect on the circuit.

The output signals from latches 74(0) through 74(N) are coupled to respective input terminals of a set of AND gates 75(0) through 75(N), whose output terminals are connected to the chip output terminals 34(0) through 34(N). AND gates 75(0) through 75(N) are enabled by a RD EN read enable signal from a flip-flop 76, which is set when the CLK clock signal is asserted if the CLK LTH EN signal is asserted, otherwise the CLK signal causes the flip-flop to be cleared. When the flip-flop 76 is set, the RD EN read enable signal is asserted, allowing the output signals from latches 74(0) through 74(N) to be transmitted therethrough as the DATA OUT (N:0) signals; otherwise the signals from latches 74(0) through 74(N) are blocked.

Latches 73(0) and 73(N) are provided in the embodiment of the output register 33 depicted in FIG. 3 since it is desired to maintain the previously retrieved data on the DATA OUT (N:0) signal lines while a subsequent write operation is taking place and when the CLK LTH EN latched clock enabling signal is negated. If a read operation is taking place, the WRT LTH latched write signal is negated. Accordingly, the multiplexers 71(0) through 71(N) couple the signal at the "0" input terminals to the output terminals for transmission to the respective latches 72(0) through 72(N). That data is latched in the latches 73(0) through 73(N) when the CLK clock signal from next negated. The output signals of latches 73(0) through 73(N), namely the HOLD MASK DATA (N:0) signals are coupled to the respective "1" input terminals of multiplexers 71(0) through 71(N). When the WRT LTH signal is asserted, in response to the write operation request from circuitry external to the chip containing the self-timed RAM circuit 10 (FIG. 1), or when the CLK LTH EN latched clock enable signal is negated, the multiplexers 71(0) through 71(N) couple the previously-stored HOLD MASK DATA (N:0) signals to the input terminals of latches 72(0) through 72(N), maintaining the read data on the data out (0) through (N) signal lines to terminals 34(0) through 34(N).

It will be appreciated by those skilled in the art that by providing registers to latch the input and output signals on the RAM chip, and by putting the write control signal circuitry on the chip, a number of benefits are provided over the pre-existing RAM chips. Since the chip does not perform an operation in response to the input signals coupled to the chip until they are latched in response to the CLK timing signal received at terminal 20, skew problems and required tolerances therefor are substantially reduced. Furthermore, providing the write pulse generation circuitry directly on the chip further reduces the skew problems, as typically the signals generated by such circuitry are not necessarily contemporaneous with clock signals, making development of such circuitry in high-speed systems somewhat difficult. With the instant self-timed RAM chip, a system designer need not provide such circuitry. Furthermore, since the input and output signals are latched in registers, the chip is capable of pipelined operation. This is particularly evident in connection with read operations. Specifically, when the input signals for an operation are latched in response to the assertion of the CLK signal, the read data in response to the input signals that were latched in response to the previous assertion of the CLK clock signal is latched. The operation of the self-timed RAM chip depicted in FIG. 1 can be made much faster in pipelined systems than prior RAM chips.

Figure 4A:
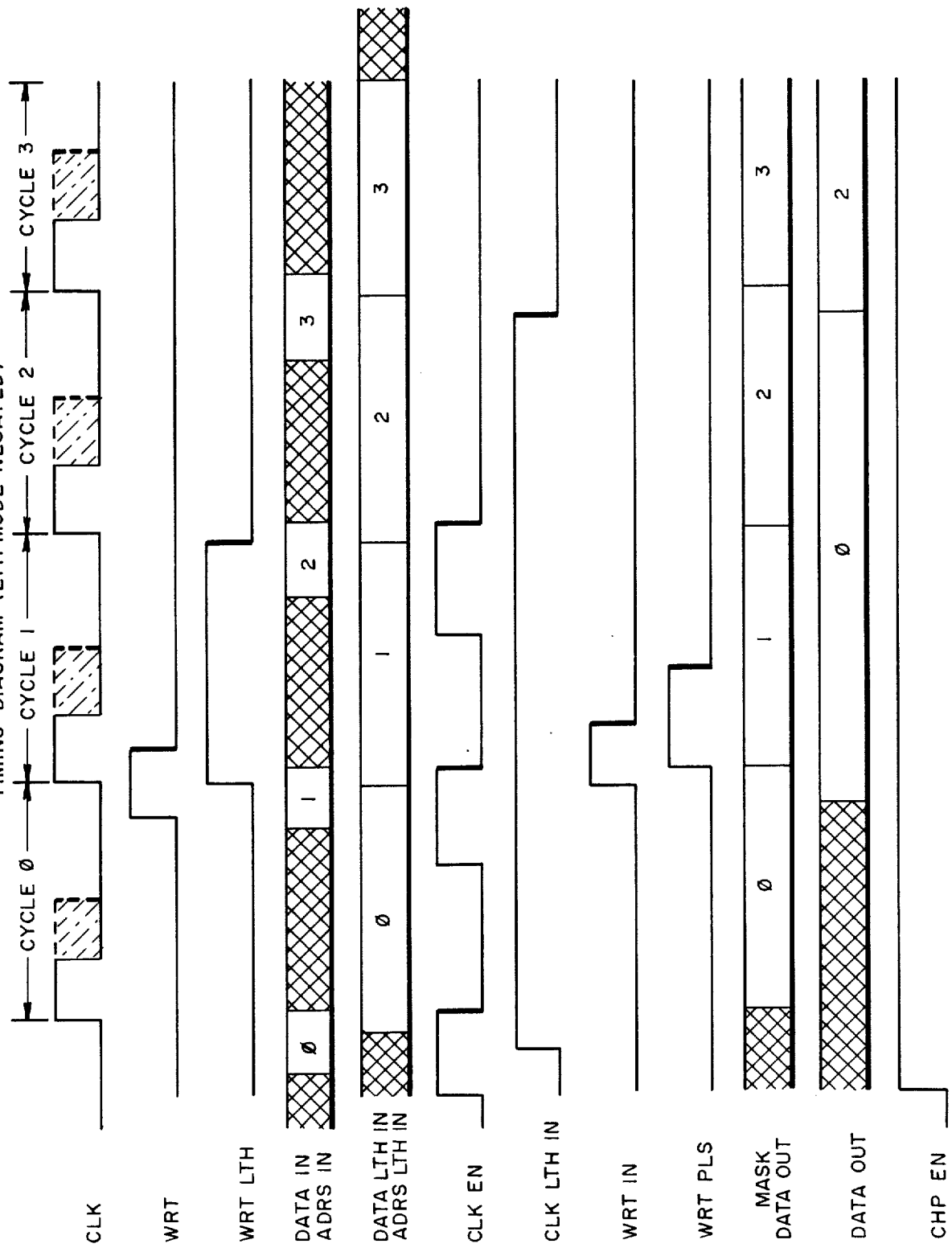

The operation of the self-timed RAM chip depicted in FIG. 1 is set forth in the timing diagram of FIG. 4A, when the LTH MODE latch mode signal is negated. The differences in operation when the LTH MODE latch mode signal is asserted will be described in connection with FIG. 4B.

FIG. 4A depicts the timing of four successive cycles, denominated Cycle 0, Cycle 1, Cycle 2 and Cycle 3, of the CLK clock signal. During Cycle 1, a write request is received from off-chip, and during Cycles 0, 2 and 3, read requests are received.

Since input registers 16, 21, 23, 25, 27, and 31 are edge-triggered devices, when the CLK clock signal is asserted at the beginning of cycle 0, the WRT, DATA IN, ADRS IN, CHP EN, CLK EN and BIT EN signals are clocked into their respective registerswhen the CLK clock signal shifts to an asserted state, that is, to a high state as shown in the Figure. Throughout the exemplary operations depicted in FIGS. 4A and 4B, it is assumed that the BIT EN (N:0) signals are asserted; if one or more of the signals is negated, the operation of the circuit 10 is modified to disable the reading or writing of the corresponding DATA LTH IN (N:0) latched input data signal. Since the WRT signal is low (negated) the WRT LTH, WRT EN and WR PLS signals, as well as the WE (N:0) write enable signals, all remain negated during cycle 0.

The latched ADRS IN signals are coupled to respective input terminals 12 and 13 of RAM 11 when the CLK clock signal shifts to the asserted state, or more specifically, a short time thereafter as determined by the delays in the gates of registers 16 and 21 and in the lines connecting the registers to the RAM 11. Since the operation is a read operation, the condition of the DATA LTH IN (N:0) signals is irrelevant.

Conventional address decoding circuitry in RAM 11 selects the addressed location identified by the ADRS LTH IN signals. Conventional sense amplifiers in the output circuitry of the RAM determine the states of the signals from the selected location, that is whether they are asserted or negated, and transmit the RAM DATA OUT (N:0) signals in response thereto. The RAM DATA OUT (N:0) signals are transmitted a short time after the transmission of the ADRS LTH IN signals to address input terminals 13 of RAM 11, the timing being dependent on delays inherent in the internal circuitry of RAM 11. In response to the RAM DATA OUT (N:0) signals, the MASK DATA OUT (N:0) signals are generated.

Since, in the operations depicted in FIG. 4A, the LTH MODE latch mode signal is negated and the CLK LTH EN signal is asserted, the MASK DATA OUT (N:0) signals is latched in latches 73(0) through 73(N) and 74(0) through 74(N) on the rising edge of the CLK clock signal marking the beginning of cycle 1. Since the CHP LTH EN signal is asserted, flip-flop 76 sets on the transition of the CLK signal marking the beginning of Cycle 1, and so the asserted RD EN read enabling signal enables AND gates 75(0) through 75(N), allowing the signals from latches 74(0) through 74(N) to be coupled to output terminals 34(0) through 34(N). The read data requested in cycle 0 thus is available at the beginning of cycle 1.

The operations of self-timed RAM 10 during the other cycles depicted on FIGS. 4A and 4B are similar, except as follows. With respect to cycle 1 depicted on FIG. 4A, since the WRT write signal is asserted on the rising edge of the CLK clock signal, it is latched and an asserted WRT LTH latched write signal is transmitted to AND gate 35 (FIG. 1). Since the CLK LTH EN latched clock enable signal is asserted, the WRT EN signal is also asserted when the DLY CLK delayed clock signal is asserted. In response thereto, the write pulse generation circuitry 37 (FIG. 1) generates an asserted WRT PLS write pulse signal. The WRT PLS signal enables the RAM 11 to store the DATA LTH IN (N:0) signals in the storage location specified by the ADRS LTH IN latched address in signals from register 21. Since the WRT LTH signal is asserted, the output register 33 maintains the DATA OUT (N:0) output data signals from cycle 1 through cycle 2.

In cycle 2 a read operation is initiated, which progresses in the same way as the read operation in cycle 0. Near the end of cycle 2, however, the CLK EN signal is negated, and at the transition of the CLK signal at the beginning of cycle 3, the CLK LTH EN latched clock enable signal is also negated. In cycle 3, a read operation is being requested by the external circuitry (not shown), but since the CLK LTH EN signal is negated, AND gate 83 is disabled during the next cycle (not shown) forcing the DATA OUT (N:0) data output signals to remain the same as in the previous cycle (that is, as in Cycle 3).

The operations of the self-timed RAM 10 (FIG. 1) when the LTH MODE signal is asserted will be described in connection with FIG. 4B. As with the sequence when the LTH MODE signal is negated, the read data requested at the beginning of one cycle is available at the beginning of the next cycle, but the data is initially latched, by latches 72(0) through 72(N), when the CLK clock signal falls to a low (negated) state. The latched LTH MASK DATA (N:0) signals from latches 72((0) through 72(N) are then latched in the latches 73(0) through 73(N) and 74(0) through 74(N) when the CLK clock signal next shifts to an asserted (high) condition. When the CLK clock signal is in a high (asserted) condition, the LTH MASK DATA (N:0) latched mask data output signals from latches 72(0) through 72(N) signals correspond to the input signals from multiplexers 71(0) through 71(N).

The modes controlled by the LTH MODE latch mode signal are provided to allow self-timed RAM 10 to accommodate to both high and low clock speeds. In particular, if the CLK clock signal is at a relatively high speed, the LTH MODE signal is preferably negated. However, if the CLK clock signal is at a relatively low speed, the LTH MODE signal is preferably asserted. In this mode, the RAM DATA OUT (N:0) signals from RAM 11 are latched in latches 72(0) through 72(N) on the falling edge of the CLK signal, not on the later rising edge as in the other mode, and so the RAM 11 does not have to maintain the RAM DATA OUT (N:0) signals for as long a time.

Figure 5:
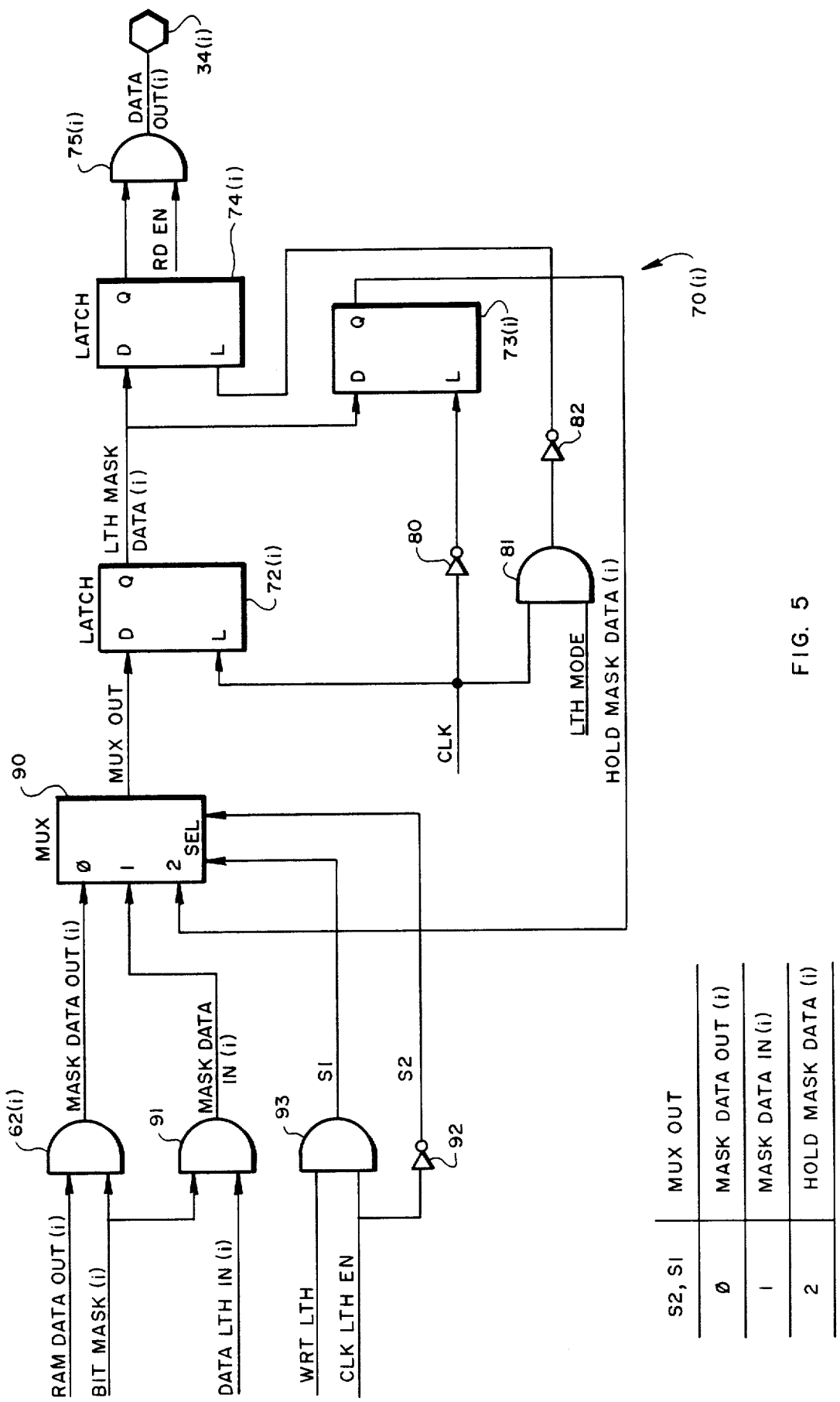
FIG. 5 is an alternate embodiment of an output register which is useful in the circuit depicted in FIG. 1.

As has been noted, the data output register depicted in FIG. 3 maintains the read data as the DATA OUT (N:0) signals during a subsequent write operation. FIG. 5 depicts a stage 70(i) useful in such a register if it is desired to couple write data through as the DATA OUT (N:0), and not maintain previous read data. The stage includes latches 72(i), 73(i) and 74(i) and the register includes control circuitry 80, 81 and 82 as in the register depicted on FIG. 3. In addition, the stage also includes an output AND gate 75(i) controlled by the RD EN signal from flip-flop 76 (FIG. 3).

The stage also includes an input multiplexer 90 which includes three data input terminals, one which receives the MASK DATA OUT (i) signal from the AND gate 62(i), whixh corresponds to the data bit from RAM 11 of the BIT MASK (i) signal is asserted. Another input terminal receives the HOLD MASK DATA (i) signal from latch 73(i) which will be used if the CLK LTH EN latched clock enable signal is asserted. In addition, the multiplexer receives a MASK DATA IN (i) signal from and AND gate 91, which is the DATA LTH IN (i) write data bit from data input register 16, if the corresponding BIT MASK (i) is asserted.

The multiplexer receives two binary-encoded control signals, namely 51 and 52, which determines which input signal is coupled through as the MUX OUT signal to the data input of latch 72(i). When the CLK LTH EN signal is negated, the 52 signal is asserted by inverter 92 and the S1 signal generated by AND gate 93 is negated, and the HOLD MASK DATA (i) signal is passed by multiplexer 90. If the CLK LTH EN signal is asserted, the 52 signal is negated and the 51 signal from AND gate 91 control multiplexer 91. If the WRT LTH sginal is asserted, indicating a write operation, the S1 signal is also asserted, causing multiplexer 91 to couple the MASK DATA IN (i) signal to the input terminal of latch 72(i). Otherwise, a read operation is occurring and the S1 signal is negated, causing the multiplexer 80 to couple the MASK DATA OUT (i) signal to the data input terminal of latch 72(i).

Figure 6A:
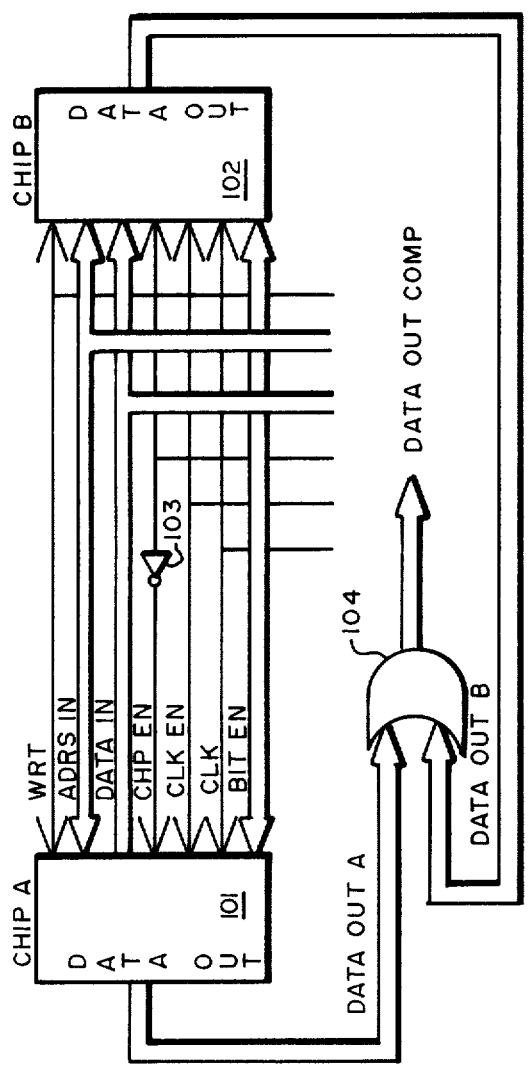
FIG. 6A is a block diagram depicting a system including multiple self-timed random access memory chips as depicted in FIG. 1 in a memory subsystem.
Figure 6B:
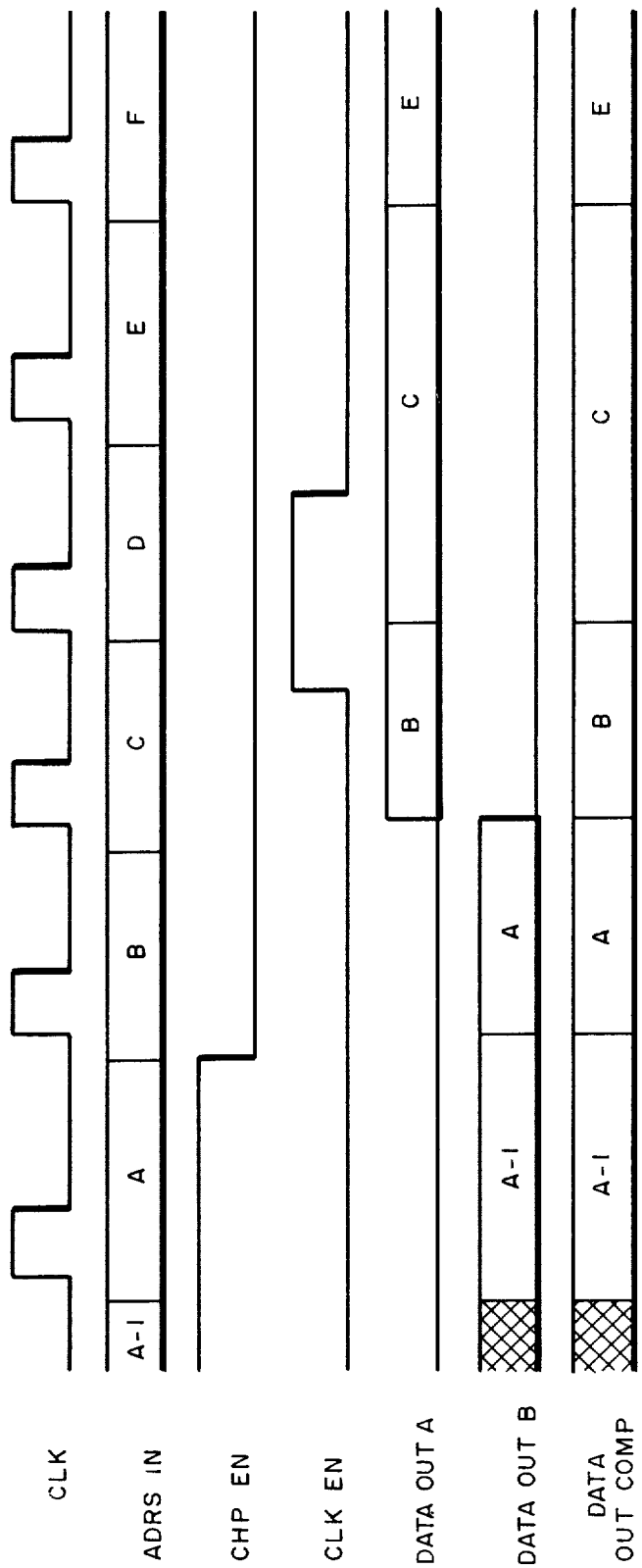
FIG. 6B is a timing diagram that is useful in understanding the operation of the system depicted in FIG. 6A.

FIG. 6A illustrates the use of the self-timed RAM chips as depicted in FIG. 1, in a system 100. The system 100 includes a chip A 101 and chip B 102 connected to receive the input signals in parallel, except that the CHP EN chip enable signal transmitted to chip A 101 is complemented by means of an inverter 103. The respective DATA OUT (N:0) signals from chips A and B are ORed together in a plurality of OR gates 104 to form DATA OUT COMP (N:0) composite data out signals. With reference to FIG. 6B, which presents a timing diagram illustrating the operation of system 100 (FIG. 6A), when the CHP EN chip enable signal is asserted, chip B 102 is enabled to transmit read data signals as the DATA OUT B signals, and the DATA OUT COMP composite data signals correspond to the DATA OUT B signals transmitted by chip B 102. Similarly, when the CHP EN signal is negated, the DATA OUT COMP signals correspond to the DATA OUT A signals transmitted by chip A 101. When the CLK EN signal is asserted, however, as it is when during cycle (D), the output signals from chip A 101 are inhibited from changing state, and the read data present on the output lines, specifically the output data for cycle "C" is maintained on the output lines of chip A 101.

The foregoing description is limited to a specific embodiment of this invention. It will be apparent, however, that this invention can be practiced in systems having diverse basic construction or that use different internal circuitry than is described in the specification with the attainment of some or all of the advantages of this invention. Therefore, it is the object of the appended claims to cover all such variations as come within the true spirit and scope of this invention.

What is claimed as new and desired to be secured by Letters Patent of the United States is:

1. A self-timed random access memory on a monolithic integrated circuit chip including data input terminal means for receiving data input signals, address signal terminal means for receiving address signals, memory operation control signal terminal means for receiving a memory operation control signal and timing signal terminal means for receiving a timing signal and data output terminal means for transmitting data output signals, said chip further including:
   A. data storage means connected to said data input terminal means and said timing signal terminal means for storing data representative of said data input signals at said data input terminal means in response to the receipt said timing signal;
   B. address signal storage means connected to said address signal terminal means and said timing signal terminal means for storing an address representative of said address signals at said address signal terminal means in response to the receipt of said timing signals;
   C. control signal storage means connected to said memory operation control signal terminal means and said timing signal terminal means for storing control data representative of said memory operation control signals at said memory operation control signal terminal means in response to the receipt of said timing signal;
   D. data output storage means connected to said data output terminal means and said timing signal terminal means for storing data for transmission to said data output terminal means in response to the receipt of said timing signal;
   E. control signal generating means connected to said control signal storage means for generating an internal memory operation control signal in response to the memory operation control data stored in said control signal storage means and the receipt of said timing signal, said control signal generating means including:
      i. timing signal delay means connected to said timing signal terminal means for generating a delayed timing signal,
      ii. enabling signal generating means having an input terminal connected to said control signal storage means and a second input terminal connected to said timing signal delay means, and having an output terminal for generating an enabling signal in response to the contents of said control signal storage means and said delayed timing signal,
      iii. flip-flop means having a set and a reset condition for generating a control pulse signal,
      iv. flip-flop control means connected to said enabling signal generating means and said flip-flop means for generating a signal in response to said enabling signal that forces said flip-flop means to a set condition and a second signal that forces said flip-flop to a reset condition,
      v. a plurality of control signal coincidence means each having an input terminal connected to receive said control pulse signal from said flip-flop means and a second input terminal connected to one of said bit enable storage means for receiving the bit enable data stored therein, each control signal coincidence means generating one of said internal bit operation control signals in response to said control pulse signal and the bit enable data stored in said bit enable storage means; and
   F. random access memory means connected to said data input storage means, said address signal storage means, said control signal generating means and said data output storage means and including a plurality of addressable storge locations for receiving the internal memory operation control signal and for storing data received from said data input storage means at, or transmitting stored data from locations identified by an address from said address signal storage means in response to said internal memory operation control signal from said control signal generating means, each said storage location containing a predetermined number of bit locations each for storing a bit of data, said data comprising the same predetermined number of bits, and said random memory access means including:
      1. bit enable terminal means for receiving bit enable signals each corresponding to one of said bit locations,
      2. bit enable storage means connected to said bit enable terminals means and said timing signal terminal means for storing bit enable data representative of said bit enable signals at said bit enable terminal means in response to the receipt of said timing signal; said internal memory operation control signal comprising the same predetermined number of internal bit operation control signals and said control signals generating means further being connected to said bit enable storage means and generating said internal bit operation control signals in response thereto the bit enable data stored therein; and said random access memory means being responsive to said internal bit operation control signals for controlling the transmission or retrieval of data to or from correponding bit locations of said addressed location.

2. A self-timed random access memory as defined in claim 1 wherein said chip further includes clock enable terminal means for receiving a clock enable signal and clock enable storage means connected to said clock enable terminal means and said timing signal terminal means for storing clock enable data representative of said clock enable signal in response to the receipt of said timing signal, said enabling signal generating means being further connected to said clock enable storage means, such that the clock enable data in said clock enable storage means furhter controls the operation of said enabling signal generating means.

3. A self-timed random access as defined in claim 1 wherein said chip further includes chip enable terminal means for receiving a chip enable signal and chip enable storage means connected to said chip enable terminal means and said timing signal terminal means for storing chip enable data representative of said chip enable signal in response to the receipt of said timing signal, said chip further including a plurality of bit enable coincidence means intermediate said bit enable storage means and said control signal coincidence means each having an input terminal connected to one of said bit enable storage means and a second input terminal connected to said chip enable storage means for receiving said chip enable data and for generating a bit mask signal in response thereto both input signals, said bit mask signal controlling said control signal coincidence means.

4. A self-timed random access memory as defined in claim 1 wherein said random access memory means includes random access memory output terminal means for transmitting a plurality of data output signals in parallel, said data output storage means including a plurality of output latch means each connected to receive and store data representative of one of said data output signals in response to the receipt of a timing signal from said timing signal terminal means.

5. A self-timed random access memory as defined in claim 4 wherein said chip further includes latch mode terminal means for receiving a latch mode signal having a first condition and a second condition, and said data output storage means further includes:

i. a plurality of input latch means each connected intermediate said random access memory output terminal means and said output latch means for storing output data representative of said output signals from said random access memory output terminal means in response to a first portion of the cycle of an enabling signal and transmits said data in response to a second portion of the cycle of said enabling signal; and ii. control means connected to said input latch means and said output latch means for generating said enabling signals to control said input latch means and said output latch means in response to said timing signal and said latch mode signal, said enabling signals alternately enabling said input latch means and said output latch means to latch the data at the input of said respective latch means when said latch mode signal is in its first condition, and enabling said output latch means to continuously pass the data at their outputs when said latch mode signal is in its second condition.

6. A self-timed random access memory as defined in claim 5 further comprising: data multiplexer means connected intermediate said random access memory output terminal means and said data output storage means and including A. write latch means connected intermediate each said input latch means and output latch means responsive to said timing signal for storing data representative of the output signals from said input latch means, B. multiplexer means having an input connected to receive signals representative of data from said random access memory means, a second input connected to receive signals representative of the data stored in said write latch means and an output connected to said input latch means and controlled by a control signal from said control signal storage means for coupling the signal from one of said random access memory means or said write latch means in response to the control signal from said control signal storage means.

* * * * *